US 12,453,251 B2

(12) United States Patent
Han et al.

(10) Patent No.: US 12,453,251 B2
(45) Date of Patent: *Oct. 21, 2025

(54) DISPLAY APPARATUS

(71) Applicant: Samsung Display Co., Ltd., Yongin-si (KR)

(72) Inventors: Mijung Han, Yongin-si (KR); Youngdae Kim, Yongin-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/665,649

(22) Filed: May 16, 2024

(65) Prior Publication Data
US 2024/0306422 A1 Sep. 12, 2024

Related U.S. Application Data

(63) Continuation of application No. 18/088,881, filed on Dec. 27, 2022, now Pat. No. 12,016,197, which is a
(Continued)

(30) Foreign Application Priority Data

Jan. 2, 2020 (KR) .................. 10-2020-0000486

(51) Int. Cl.
H10K 59/122 (2023.01)
H10K 50/844 (2023.01)
(Continued)

(52) U.S. Cl.
CPC ......... H10K 59/122 (2023.02); H10K 50/844 (2023.02); H10K 59/8731 (2023.02);
(Continued)

(58) Field of Classification Search
CPC .. H10K 59/122; H10K 59/8731; H10K 59/40; H10K 59/8791; H10K 59/879;
(Continued)

(56) References Cited

U.S. PATENT DOCUMENTS 10,431,771 B2  10/2019  Park et al.
10,862,068 B2  12/2020  Choi et al.
(Continued)

FOREIGN PATENT DOCUMENTS

CN   108074959 A   5/2018
CN   109509769 A   3/2019
(Continued)

OTHER PUBLICATIONS

PTO-0892 Notice(s) of References Cited (1 page) and PTO-1449 Notice(s) indicating references considered by Examiner (9 pages), in related (parent) U.S. Appl. No. 18/088,881.

Primary Examiner — Shaun M Campbell
(74) Attorney, Agent, or Firm — CANTOR COLBURN LLP

(57) ABSTRACT

A display apparatus includes a display element; a substrate including: an opening area, a display area adjacent to the opening area, a non-display area between the opening area and the display area, and a boundary line separating the opening area from the non-display area; an encapsulation layer including: a first inorganic encapsulation layer, an organic encapsulation layer and a second inorganic encapsulation layer in the display area, and the first inorganic encapsulation layer and the second inorganic encapsulation layer extending from the display area to the non-display area; and a dam portion in the non-display area and corresponding to the boundary line. The dam portion which corresponds to the boundary line includes a plurality of grooves in which the first inorganic encapsulation layer and
(Continued)

the second inorganic encapsulation layer which are in the non-display area, are in contact with each other.

12 Claims, 12 Drawing Sheets

Related U.S. Application Data continuation of application No. 16/922,123, filed on Jul. 7, 2020, now Pat. No. 11,557,746.

(51) Int. Cl.
*H10K 59/40* (2023.01)
*H10K 59/80* (2023.01)
*H10K 77/10* (2023.01)

(52) U.S. Cl.
CPC ............. *H10K 77/10* (2023.02); *H10K 59/40* (2023.02); *H10K 59/80* (2023.02); *H10K 59/8052* (2023.02); *H10K 59/879* (2023.02); *H10K 59/8791* (2023.02)

(58) Field of Classification Search
CPC .... H10K 59/8052; H10K 59/80; H10K 77/10; H10K 50/844
See application file for complete search history.

(56) References Cited

U.S. PATENT DOCUMENTS

| | | |
|---|---|---|
| 10,916,603 B2 | 2/2021 | Park et al. |
| 11,245,093 B2 | 2/2022 | Sung et al. |
| 11,367,759 B2 | 6/2022 | Huh |
| 12,016,197 B2 * | 6/2024 | Han .................... H10K 59/8731 |
| 2021/0200365 A1 * | 7/2021 | Lee ........................ H10K 59/38 |
| 2022/0199697 A1 * | 6/2022 | Zhu ...................... H10K 59/122 |

FOREIGN PATENT DOCUMENTS

| | | |
|---|---|---|
| CN | 110034239 A | 7/2019 |
| CN | 111048551 A | 4/2020 |
| CN | 111384104 A | 7/2020 |
| KR | 20160064373 A | 6/2016 |

* cited by examiner

DISPLAY APPARATUS

This application is a continuation application of U.S. application Ser. No. 18/088,881 filed Dec. 27, 2022, which is a continuation application of U.S. application Ser. No. 16/922,123 filed Jul. 7, 2020 and issued as U.S. Pat. No. 11,557,746 on Jan. 17, 2023, which claims priority to Korean Patent Application No. 10-2020-0000486, filed on Jan. 2, 2020, and all the benefits accruing therefrom under 35 U.S.C. § 119, the disclosure of which is incorporated herein in its entirety by reference.

BACKGROUND

1. Field

One or more embodiments relate to a display apparatus, and more particularly, to a display apparatus including a display panel having an opening area.

2. Description of Related Art

Use of display apparatuses has diversified. Also, as display apparatuses become slimmer and lighter, a range of use of such display apparatuses has widened.

As a planar area occupied by a display area in a display apparatus has been expanded, various functions combined and/or associated with a display apparatus have been added. As a method of adding various functions while increasing the display area, research has been conducted into a display apparatus having a planar area for adding various functions within the display area, other than a function such as an image display.

SUMMARY

One or more embodiments include a highly reliable display apparatus including a display panel having an opening area inside a display area.

Additional features will be set forth in part in the description which follows and, in part, will be apparent from the description, or may be learned by practice of the embodiments of the disclosure.

According to one or more embodiments, a display apparatus includes a display element including a pixel electrode and an opposite electrode; a substrate including: an opening area corresponding to a component which uses light or sound for a function associated with the display apparatus, a display area including the display element and adjacent to the opening area, a non-display area between the opening area and the display area, and a boundary line separating the opening area from the non-display area; an encapsulation layer including: a first inorganic encapsulation layer, an organic encapsulation layer and a second inorganic encapsulation layer in the display area and each covering the display element, and the first inorganic encapsulation layer and the second inorganic encapsulation layer extending from the display area to the non-display area; and a dam portion in the non-display area and corresponding to the boundary line which separates the opening area from the non-display area. The dam portion which corresponds to the boundary line includes a plurality of grooves in which the first inorganic encapsulation layer and the second inorganic encapsulation layer which are in the non-display area, are in contact with each other.

In an embodiment, a width of each of the plurality of grooves may increase and then decrease in a thickness direction of the substrate.

In an embodiment, the display apparatus may further include a first opposite electrode pattern in a same layer as the opposite electrode and between a plurality of grooves adjacent to each other.

In an embodiment, the display apparatus may further include a second opposite electrode pattern spaced apart from the first opposite electrode pattern in the plurality of grooves.

In an embodiment, the display element may further include an intermediate layer between the pixel electrode and the opposite electrode, and the display apparatus may further include a first intermediate layer pattern in a same layer as the intermediate layer and between the plurality of grooves adjacent to each other.

In an embodiment, the display apparatus may further include a second intermediate layer pattern spaced apart from the first intermediate layer pattern and in the plurality of grooves.

In an embodiment, the display apparatus may further include a pixel defining layer including an opening exposing the pixel electrode, and a spacer on the pixel defining layer. The dam portion may further include a first layer in a same layer as the pixel defining layer, and a first auxiliary dam in a same layer as the spacer.

In an embodiment, bottom surfaces of the plurality of grooves may coincide with an upper surface of the first layer.

In an embodiment, the plurality of grooves may be defined by the first auxiliary dam and the first layer.

In an embodiment, a thickness of a pattern portion between the plurality of grooves adjacent to each other, may be less than a thickness of the first auxiliary dam.

In an embodiment, the display apparatus may further include a second auxiliary dam on the first auxiliary dam.

In an embodiment, the first auxiliary dam may define an upper groove.

In an embodiment, a depth of the upper groove may be equal to a thickness of the first auxiliary dam.

In an embodiment, the substrate may define a lower groove in the non-display area and spaced apart from the dam portion in a direction from the opening area to the display area.

In an embodiment, the organic encapsulation layer may fill the lower groove.

In an embodiment, the display apparatus may further include a touch input layer including an insulating layer and a sensing electrode on the encapsulation layer.

In an embodiment, the insulating layer may be inside the plurality of grooves.

According to one or more embodiments, a display apparatus includes a substrate including an opening area corresponding to a component which uses light or sound for a function associated with the display apparatus, a display area adjacent to the opening area and including a display element and, and a non-display area between the opening area and the display area; a dam portion in the non-display area and including a plurality of grooves; an encapsulation layer covering the display element; and a touch input layer including an insulating layer and a sensing electrode in the display area, the touch input layer facing the substrate with the encapsulation layer therebetween. The insulating layer in the display area extends from the display area to the non-display area, and the insulating layer which is in the non-display area extends into the plurality of grooves of the dam portion.

In an embodiment, the dam portion may coincide with a boundary line which separates the opening area from the non-display area.

In an embodiment, the insulating layer may include an inorganic layer and an organic layer, and the inorganic layer may fill the plurality of grooves.

BRIEF DESCRIPTION OF THE DRAWINGS

The above and other features, and advantages of embodiments of the disclosure will be more apparent from the following description taken in conjunction with the accompanying drawings, in which.

DETAILED DESCRIPTION

Figure 1:
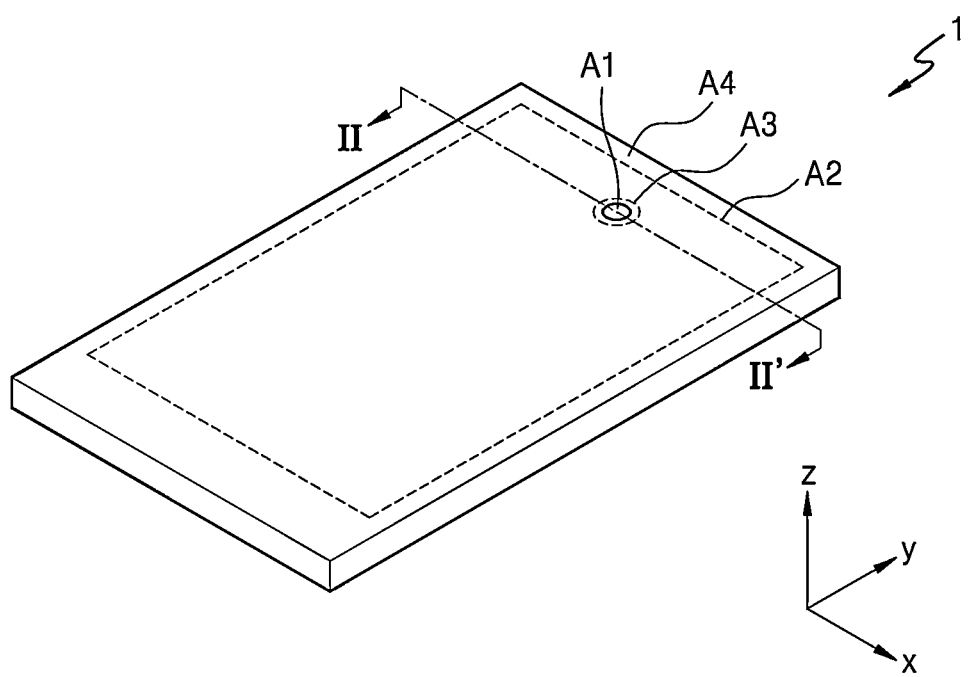
FIG. 1 is a schematic perspective view of an embodiment of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the figures, to explain features of the present description.

The disclosure may have various modifications and embodiments. Embodiments are illustrated in the drawings and will be described in detail in the detailed description. The advantages and features of the disclosure and methods for achieving them will become more apparent from the following embodiments that are described in detail in conjunction with the accompanying drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals and a redundant description thereof will be omitted.

It will be understood that although the terms "first," "second," etc. may be used herein to describe various elements, these elements should not be limited by these terms. These terms are only used to distinguish one element from another.

The terminology used herein is for the purpose of describing particular embodiments only and is not intended to be limiting. As used herein, the singular forms "a," "an," and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that terms such as "comprise," "include," and "have" used herein specify the presence of stated features or elements, but do not preclude the presence or addition of one or more other features or elements.

Sizes of components in the drawings may be exaggerated for convenience of description. In other words, because the sizes and thicknesses of elements in the drawings are arbitrarily illustrated for convenience of description, the following embodiments are not limited thereto.

When an embodiment may be implemented differently, a process order may be performed differently from the described order. For example, two consecutively described processes may be performed substantially at the same time or performed in an order opposite to the described order.

In the following embodiments, it will be understood that when a film, layer, region, element, or component is referred to as being related to another element such as being "on," "connected to" or "coupled to" another film, layer, region, element, and component, it may be directly or indirectly connected or coupled to the other film, layer, region, element, or component. That is, for example, intervening films, regions, or components may be present. In the following embodiments, it will be understood that when a film, layer, region, element, or component is referred to as being related to another element such as being "electrically connected to" or "electrically coupled to" another film, layer, region, element, and component, it may be directly or indirectly electrically connected or coupled to the other film, layer, region, element, or component. That is, for example, intervening films, layers, regions, elements, or components may be present. In contrast, when a layer, region, or element is referred to as being related to another element such as being "directly on," "directly connected to" or "directly coupled to" another layer, region or element, no intervening layer, region or element is therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a schematic perspective view of an embodiment of a display apparatus 1.

Referring to FIG. 1, the display apparatus 1 may include a first area A1 and a second area A2 which is adjacent to the first area A1, such as surrounding the first area A1. A pixel P provided in plurality (e.g., plurality of pixels P), for example, an array of pixels P, may be arranged in the second area A2. The second area A2 may allow an image to be displayed through operation or control of the array of pixels P. The second area A2 corresponds to a display area at which an image is displayed. The first area A1 may be entirely surrounded by the second area A2, in a top plan view. The first area A1 may be within the second area A2 as a display area. An entirety of a planar area of the first area A1 may be within a total planar area of the second area A2.

The first area A1 may be a planar area in which a component 20, circuitry, etc. for providing various functions to the display apparatus 1, are arranged (e.g., a component area). In an embodiment, for example, when the component 20 includes a sensor, a camera and the like as functional elements which use light within a function combined and/or associated with the display apparatus 1, the first area A1 corresponds to a transmission area through which light from the sensor to outside the display apparatus 1 and/or light traveling toward the camera from outside the display apparatus 1 is transmitted (e.g., light transmission area). The first area A1 may include an opening area OA (e.g., opening or enclosed opening) in a substrate 100 so as to increase light transmittance. The first area A1 may be considered a non-display area (e.g., a third non-display area) in which none of the pixels P is arranged. That is, an image is not displayed at the first area A1. The first area A1 may correspond to the opening area OA.

A third area A3 may be arranged between the first area A1 and the second area A2. The third area A3 is a first non-display area in which none of the pixels P is arranged. That is, an image is not displayed at the third area A3. Lines (e.g., signal lines or conductive lines) or dam portions that bypass the first area A1 (e.g., are excluded or not disposed in the first area A1), may be arranged in the third area A3. The third area A3 may be within the second area A2 as a display area. An entirety of a planar area of the third area A3 may be within a total planar area of the second area A2.

Like the third area A3, a fourth area A4 surrounding the second area A2 may be a second non-display area in which none of the pixels P is arranged. That is, an image is not displayed at the fourth area A4. Various types of lines, internal circuits and the like, for operating and/or controlling the display apparatus 1, may be arranged in the fourth area A4. Referring to FIG. 1, for example, the first area A1, the third area A3, the second area A2 and the fourth area A4 may be arranged in order, in a direction along a plane of the display apparatus 1. One or more element of the display apparatus 1 may include a first area A1, a second area A2, a third area A3 and/or a fourth area A4 corresponding to those described above for the display apparatus 1. Each of the first area A1, the second area A2, the third area A3 and/or the fourth area A4 may define an enclosed shape or enclosed planar shape.

Each one of the pixel P provided in the display apparatus 1 may include a light-emitting diode as a display element which generates and/or emitting colored light. The display element may include an organic light-emitting diode ("OLED") including an organic material as an emission layer 220b. Alternatively, the display element may include an inorganic light-emitting diode. Alternatively, the display element may include quantum dots as an emission layer 220b. Hereinafter, for convenience of description, a case in which the display element includes an OLED will be described.

The display apparatus 1 and elements thereof, may be disposed in a plane defined by a first direction (e.g., x direction) and a second direction (e.g., y direction) which crosses the first direction. A thickness of the display apparatus 1 and elements thereof, may be disposed along a third direction (e.g., z direction or thickness direction) which crosses each of the first direction and the second direction.

FIG. 1 illustrates that the first area A1 is arranged at the central portion of the second area A2, along in a width direction (e.g., +x direction) of the display apparatus 1, but is not limited thereto. In an embodiment, the first area A1 may be arranged to be offset to the left or right based on a center of the second area A2, along the width direction of the display apparatus 1. In addition, the first area A1 may be arranged at various positions along a length direction (e.g., ty direction) of the display apparatus 1, such as being disposed at an upper portion, a middle portion or a lower portion of the second area A2.

FIG. 1 illustrates that the display apparatus 1 includes one of the first area A1, but is not limited thereto. In an embodiment, the display apparatus 1 may include the first area A1 provided in plurality (e.g., a plurality of first areas A1).

Figure 2:
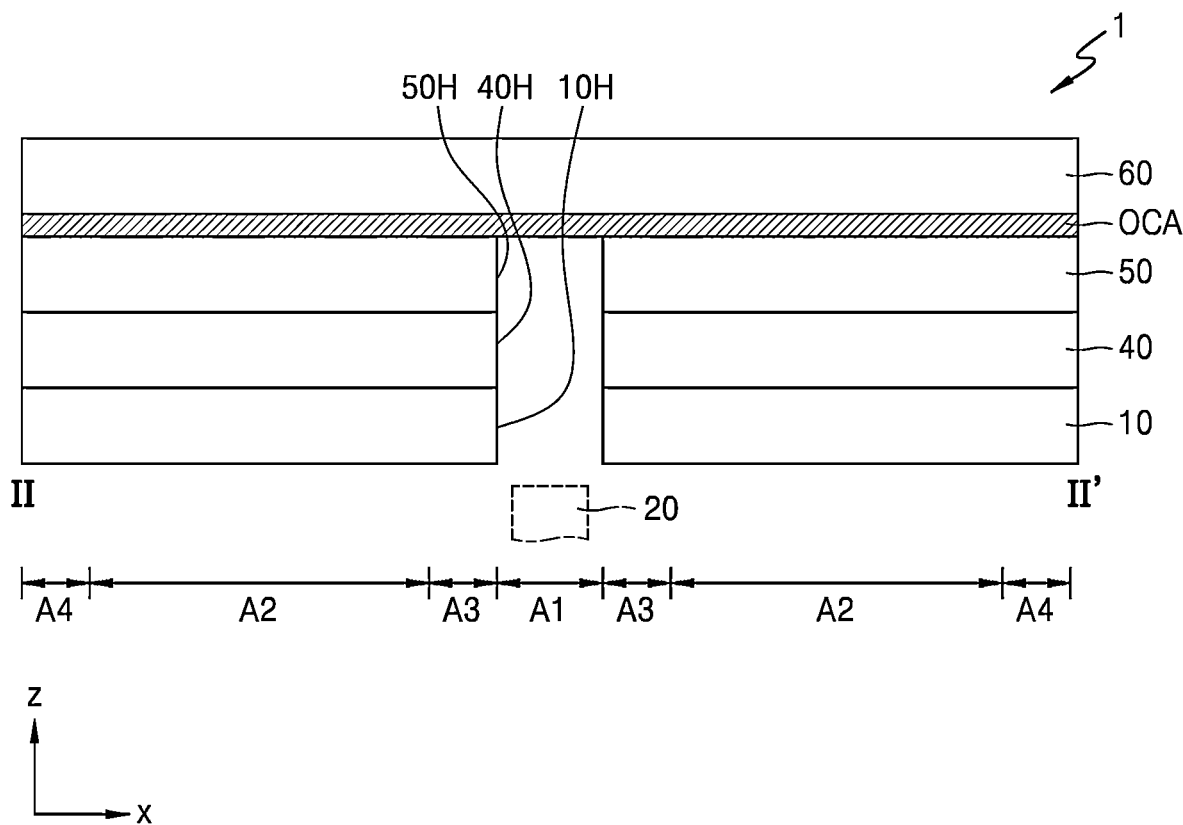
FIG. 2 is a schematic cross-sectional view of the display apparatus of FIG. 1.

FIG. 2 is a schematic cross-sectional view of the display apparatus 1 taken along line II-II' of FIG. 1.

Referring to FIG. 2, the display apparatus 1 may include a display panel 10, a touch input layer 40 (e.g., touch sensing layer) arranged on the display panel 10, and an optical function layer 50. The display panel 10, the touch input layer 40 and the optical function layer 50 may each be covered with a window 60. The window 60 may be bonded to an underlying element, for example, the optical function layer 50, such as through an adhesive layer OCA. The adhesive layer OCA may include an optical clear adhesive ("OCA"). The window 60 may form an outer surface of the display apparatus 1, without being limited thereto. The window 60 may define a display surface (or display screen) of the display apparatus 1.

The display apparatus 1 may be provided in various electronic apparatuses such as a mobile phone, a tablet personal computer ("PC"), a notebook computer or a smart watch.

The display panel 10 may include a plurality of diodes arranged in the second area A2. The touch input layer 40 may acquire coordinate information according to an external input, for example, a touch event. The touch input layer 40 may include sensing electrodes (or touch electrodes) and trace lines which are connected to the sensing electrodes. The touch input layer 40 may be arranged on the display panel 10. The touch input layer 40 may sense an external input in a mutual capacitance method or a self-capacitance method. The display panel 10 may face the window 60, with the touch input layer 40 therebetween.

The touch input layer 40 may be provided or formed directly on the display panel 10. Alternatively, the touch input layer 40 may be separately provided or formed, and then subsequently bonded through an adhesive layer OCA. In an embodiment, as illustrated in FIG. 2, the touch input layer 40 may be provided or formed directly on the display panel 10. In this case, the adhesive layer OCA may be excluded from between the touch input layer 40 and the display panel 10.

The optical function layer 50 (e.g., a light control layer) may include an anti-reflective layer. The anti-reflective layer may reduce a reflectance of light (e.g., external light) incident from outside the display apparatus 1 and toward the display panel 10 through the window 60. The anti-reflective layer may include a retarder and/or a polarizer. The retarder may be a film type retarder or a liquid crystal coating type retarder and may include a λ/2 retarder and/or a λ/4 retarder. The polarizer may also be a film type polarizer or a liquid crystal coating type polarizer. The film type polarizer may include a stretched synthetic resin film, and the liquid crystal coating type polarizer may include liquid crystals arranged in an arrangement. The retarder and/or the polarizer may each further include a protective film.

In an embodiment, the anti-reflective layer may include a structure of a black matrix and/or color filters. The color filters may be arranged considering the color of light emitted from each of a pixel P of the display panel 10.

In an embodiment, the anti-reflective layer may include a destructive interference structure. The destructive interference structure may include a first reflective layer and a second reflective layer arranged stacked such as to be in different layers. First reflected light and second reflected light, which are respectively reflected from the first reflective layer and the second reflective layer, may destructively interfere with each other, thereby reducing reflectance of external light.

The optical function layer 50 may include a lens layer. The lens layer may improve light output efficiency of the light emitted from the display panel 10 and/or may reduce color deviation. The lens layer may include a layer having a concave lens shape or convex lens shape and/or may include a plurality of layers having different refractive indices from each other. The optical function layer 50 may include either or both of the anti-reflective layer and the lens layer.

The display panel 10, the touch input layer 40 and the optical function layer 50 may each define or include a hole (e.g., a component hole). In an embodiment, for example, the display panel 10 may include a first hole 10H passing through the top surface and the bottom surface of the display panel 10 (e.g., extended through a thickness of the display panel 10), the touch input layer 40 may include a second hole 40H passing through the top surface and the bottom surface of the touch input layer 40, and the optical function layer 50 may include a third hole 50H passing through the top surface and the bottom surface of the optical function layer 50. The first hole 10H of the display panel 10, the second hole 40H of the touch input layer 40, and the third hole 50H of the optical function layer 50 may be arranged in the first area A1 and may be arranged to correspond to each other. The first hole 10H, the second hole 40H and the third hole 50H may be aligned with each other to provide a single hole or single component hole.

When the adhesive layer OCA between the window 60 and the optical function layer 50 includes an optical clear adhesive, the adhesive layer OCA may not include a hole corresponding to the first area A1 since light may still transmit through the adhesive layer OCA.

A component 20 may be arranged in the first area A1. The component 20 which defines or corresponds to the first area A1, may include an electronic element. In an embodiment, for example, the component 20 may be an electronic element using light or sound within a function combined and/or associated with the display apparatus 1. In an embodiment, for example, the electronic element may be a sensor (e.g., infrared sensor) which receives and uses light to perform a function related to the display apparatus 1, a camera which receives light and capture an image as a function related to the display apparatus 1, a sensor which outputs and senses light or sound so as to measure a distance or recognize a fingerprint as a function related to the display apparatus 1, a small lamp which outputs light as a function related to the display apparatus 1, a speaker which outputs sound as a function related to the display apparatus 1, and the like.

When the component 20 is an electronic element using light within a function combined and/or associated with the display apparatus 1, the component 20 may use light of various wavelength bands, such as visible light, infrared light and ultraviolet light. In one or more embodiments, the first area A1 may be a transmission area (e.g., light transmission area) through which light output from the component 20 is transmitted to outside the display apparatus 1 and/or light traveling toward the electronic element from outside the display apparatus 1 is transmitted.

In an embodiment, when the display apparatus 1 is used as a smart watch and/or a dashboard for a vehicle, the component 20 may be a member such as a clock hand or a needle indicating information (e.g., vehicle speed, etc.). When the display apparatus 1 includes a clock hand or needle within a dashboard for a vehicle, the component 20 may be exposed to outside the window 60 of the display apparatus 1. Here, the window 60 may include or define an opening or hole corresponding to the first area A1.

The component 20 may include a device which adds a function related to the display apparatus 1 as described above, or may include features such as accessories that increase an aesthetic appearance of the display panel 10.

Figure 3:
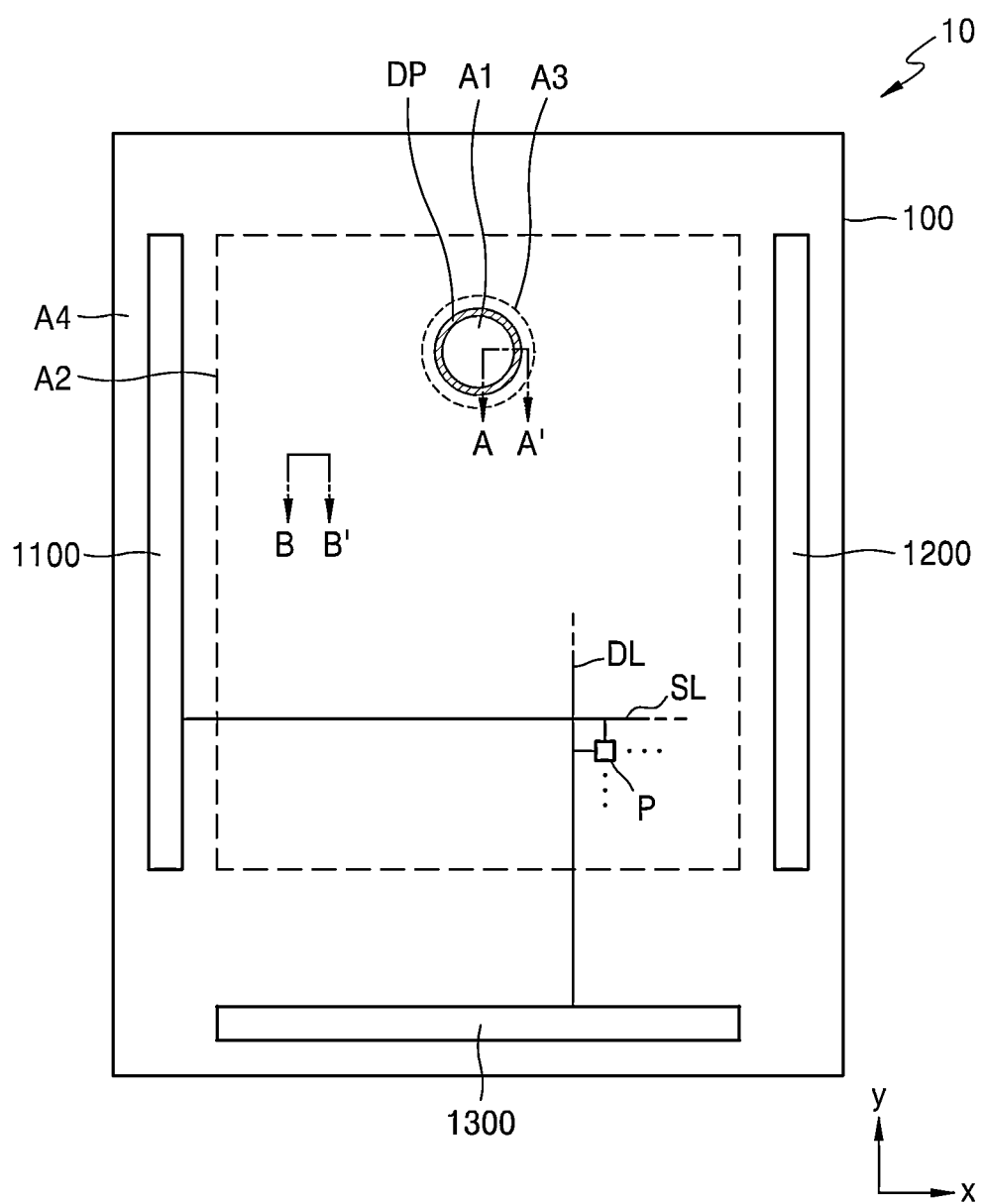
FIG. 3 is a schematic plan view of an embodiment of a display panel.
Figure 4:
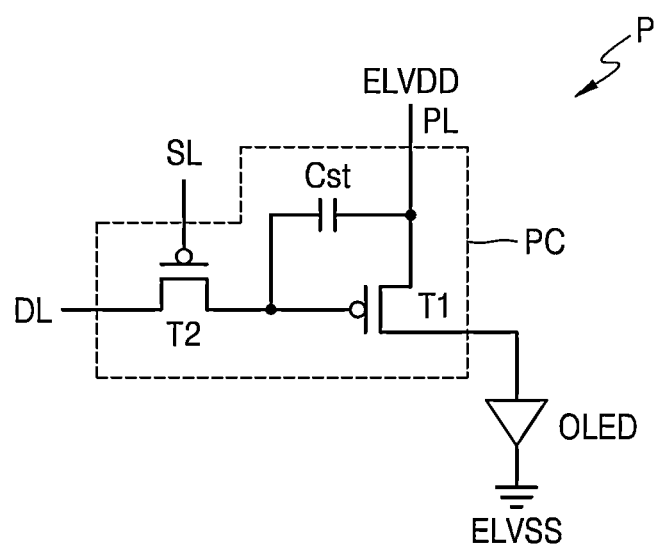
FIG. 4 is a schematic equivalent circuit of an embodiment of a pixel of a display panel.

FIG. 3 is a schematic top plan view of an embodiment of the display panel 10, and FIG. 4 is a schematic equivalent circuit of an embodiment of a pixel P in the display panel 10.

The display panel 10 may include a first area A1, a second area A2 surrounding the first area A1, a third area A3 between the first area A1 and the second area A2, and a fourth area A4 surrounding the second area A2. Alternatively, a substrate 100 of the display panel 10 may include the first area A1, the second area A2, the third area A3, and the fourth area A4.

The display panel 10 may include a plurality of pixels P arranged in the second area A2. As illustrated in FIG. 4, the pixels P may each include a pixel circuit PC and a display element which is connected to the pixel circuit PC. The display element may include, for example, an organic light-emitting diode ("OLED"). The pixel circuit PC may include a first thin-film transistor ("TFT") T1, a second TFT T2, and a storage capacitor Cst. The pixels P may each generate and/or emit, for example, light of a red color, a green color or a blue color through the OLED or may generate and/or emit, for example, light of a red color, a green color, a blue color or a white color through the OLED.

The second TFT T2 may serve as a switching TFT and may be connected to one or more of a signal line such as a scan line SL and a data line DL. The switching TFT may transfer, to the first TFT T1, an electronic signal such as a data signal input from the data line DL, according to an electronic signal such as a switching voltage input from the scan line SL. The storage capacitor Cst may be connected to the second TFT T2 and a driving voltage line PL and may store a voltage corresponding to a difference between a voltage received from the second TFT T2 and a first power supply voltage ELVDD supplied to the driving voltage line PL.

The first TFT T1 may serve as a driving TFT and may be connected to the driving voltage line PL and the storage capacitor Cst. The driving TFT may control an electrical driving current flowing from the driving voltage line PL to the OLED, according to a voltage value stored in the storage capacitor Cst. The OLED may generate and/or emit light having a luminance according to the electrical driving current. An opposite electrode (e.g., a cathode) of the OLED may receive a second power supply voltage ELVSS.

FIG. 4 illustrates that the pixel circuit PC includes two TFTs and one storage capacitor Cst, but is not limited thereto. In an embodiment, the number of TFTs and the number of the storage capacitor Cst may be variously changed according to the design of the pixel circuit PC.

Referring to FIG. 3 again, the third area A3 may surround the first area A1. The third area A3 is a planar area in which a display element such as an OLED which emits light, is excluded or not arranged. Signal lines which provide electrical signals (e.g., control signal, driving signal, power signal, etc.) to the pixels P arranged outside of and around the first area A1, may pass through the third area A3. Such signal lines which are connected to the pixel P, may bypass the first area A1 to be excluded from the first area A1.

Figure 5A:
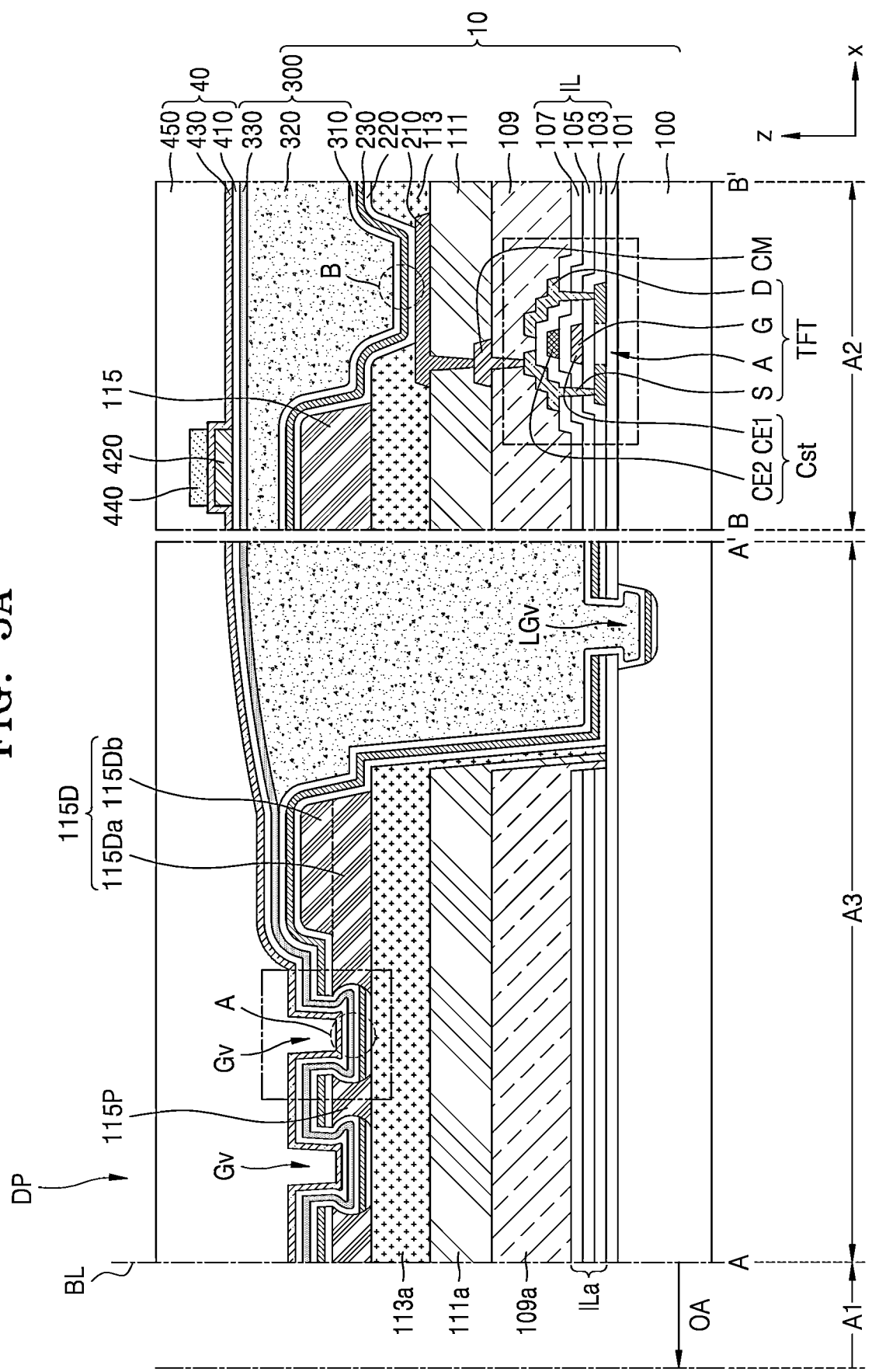
FIG. 5A is a cross-sectional view taken along lines A-A' and B-B' of FIG. 3.

In the embodiment, the third area A3 may include a dam portion DP (FIG. 5A). As described below, the dam portion DP may restrict or control a flow of an organic encapsulation layer material forming an organic encapsulation layer covering the second area A2 during manufacturing of a display apparatus 1, so as to reduce or effectively prevent penetration of such material into the first area A1. At this time, the dam portion DP may be arranged to surround the first area A1 in a top plan view. In particular, the dam portion DP may be arranged adjacent to the first area A1 in a direction along the substrate 100. That is, the dam portion DP may be adjacent to a boundary line BL that separates the first area A1 from the third area A3.

Referring again to FIG. 3, a first scan driver 1100 (e.g., a first driver) and a second scan driver 1200 (e.g., a second driver) which each provide scan signals to the pixels P, a data driver 1300 (e.g., a third driver) which provides data signals to the pixels P, main voltage lines (not illustrated) which provide the first power supply voltage ELVDD and the second power supply voltage ELVSS, and the like may be arranged in the fourth area A4. The first scan driver 1100 and the second scan driver 1200 may be arranged in the fourth area A4 and may be respectively arranged on opposing sides of the second area A2 with the second area A2 therebetween. That is, the first scan driver 1100 and the second scan driver 1200 may face each other with the second area A2 therebetween.

FIG. 3 illustrates that the data driver 1300 is arranged adjacent to one side or outer edge of the substrate 100, but is not limited thereto. In an embodiment, the data driver 1300 may be arranged on a flexible printed circuit board ("FPCB") which is a separate element from the display panel 10 and electrically connected to a pad of the display panel 10. The pad may be arranged adjacent to one side or outer edge of the display panel 10, such as corresponding to an area of the data driver 1300.

Figure 5B:
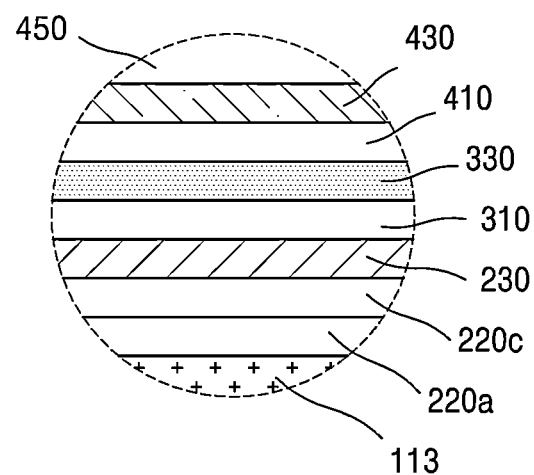
FIGS. 5B and 5C are enlarged cross-sectional views of regions A and B of FIG. 5A.
Figure 5C:
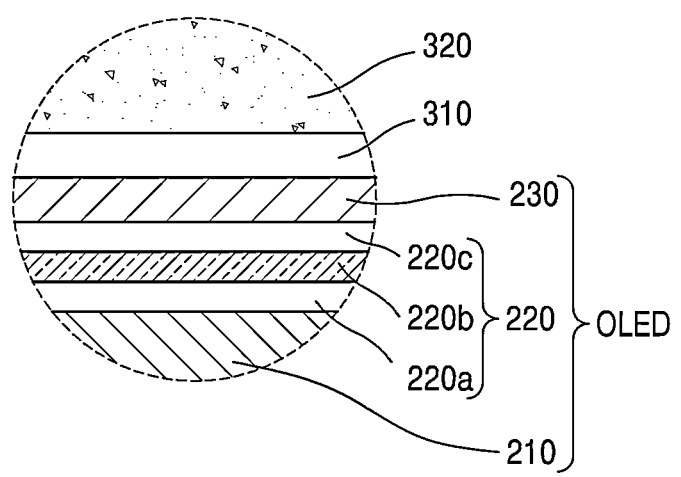

FIG. 5A is a cross-sectional view taken along lines A-A' and B-B' of FIG. 3. FIGS. 5B and 5C are enlarged cross-sectional views of regions A and B of FIG. 5A.

Referring to FIG. 5A, the display apparatus 1 may include a display panel 10 and a touch input layer 40. The display panel 10 may include a substrate 100, a buffer layer 101, an inorganic insulating layer IL, a first planarization layer 109, a second planarization layer 111, a pixel defining layer 113, and a thin-film encapsulation layer 300, which are sequentially stacked. In this case, the inorganic insulating layer IL may include a first gate insulating layer 103, a second gate insulating layer 105 and an interlayer insulating layer 107. In addition, a pixel circuit PC may be arranged on the substrate 100, and an OLED may be arranged on the pixel circuit PC. The OLED may be electrically connected to the pixel circuit PC and may include a pixel electrode 210, an intermediate layer 220 and an opposite electrode 230.

In the embodiment, the substrate 100 may include an opening area OA. The opening area OA may be arranged to correspond to a first area A1. In particular, the first area A1 and the opening area OA may be aligned with each other. The opening area OA may be surrounded by a second area A2 that is a display area. A third area A3 that is a first non-display area, may be arranged between the opening area OA and the second area A2 in a direction along the substrate 100. In this case, a dam portion DP that is adjacent to a boundary line BL that separates the first area A1 from a third area A3, may be arranged in the third area A3.

The substrate 100 may include glass or may include a polymer resin, such as polyethersulfone, polyacrylate, polyetherimide, polyethylene naphthalate, polyethylene terephthalate, polyphenylene sulfide, polyimide, polycarbonate, cellulose triacetate or cellulose acetate propionate.

The buffer layer 101 may be arranged on the substrate 100. The buffer layer 101 may reduce or block penetration of foreign matter, moisture or external air from outside a bottom surface of the substrate 100 and may provide a flat surface relative to the substrate 100. The buffer layer 101 may include an inorganic material such as oxide or nitride, an organic material or an organic/inorganic material combination, and may have a single-layered structure or a multi-layered structure including an inorganic material and an organic material. A barrier layer (not illustrated) which blocks penetration of external air may be further included between the substrate 100 and the buffer layer 101. In one or more embodiments, the buffer layer 101 may include silicon oxide ($SiO_2$) or silicon nitride ($SiN_x$).

A TFT may be disposed on the buffer layer 101. In this case, the TFT may be a driving TFT. The TFT may include a semiconductor layer A, a gate electrode G, a source electrode S and a drain electrode D.

The semiconductor layer A may be arranged on the buffer layer 101 and may include polysilicon. In an embodiment, the semiconductor layer A may include amorphous silicon. In an embodiment, the semiconductor layer A may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti) and zinc (Zn). The semiconductor layer A may include a channel region, and a source region and a drain region each doped with impurities.

The first gate insulating layer 103 may be provided to cover the semiconductor layer A. The first gate insulating layer 103 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$) or zinc oxide ($ZnO_2$). The first gate insulating layer 103 may be a single layer or a multi-layer including the above-described inorganic insulating material.

The gate electrode G may be arranged on the first gate insulating layer 103 so as to overlap the semiconductor layer A. The gate electrode G may include molybdenum (Mo), aluminum (Al), copper (Cu), titanium (Ti) or the like and may be a single layer or a multi-layer. In an embodiment, for example, the gate electrode G may be a single layer of Mo.

The second gate insulating layer 105 may be provided to cover the gate electrode G. The second gate insulating layer 105 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$) or zinc oxide ($ZnO_2$). The second gate insulating layer 105 may be a single layer or a multi-layer including the above-described inorganic insulating material.

An upper electrode CE2 of the storage capacitor Cst may be arranged on the second gate insulating layer 105.

The upper electrode CE2 may overlap the gate electrode G arranged therebelow. The gate electrode G and the upper electrode CE2 overlapping each other with the second gate insulating layer 105 therebetween, may form the storage capacitor Cst. The gate electrode G may be a lower electrode CE1 of the storage capacitor Cst.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu), and may be a single layer or a multi-layer including the above-described material.

The interlayer insulating layer 107 may be provided or formed to cover the upper electrode CE2. The interlayer insulating layer 107 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$) or zinc oxide ($ZnO_2$).

The source electrode S and the drain electrode D may be arranged on the interlayer insulating layer 107. The source electrode S and the drain electrode D may each include a conductive material including molybdenum (Mo), aluminum (Al), copper (Cu), titanium (Ti) and the like, and may each be a single layer or a multi-layer including the above-described material. In an embodiment, for example, the source electrode S and the drain electrode D may each have a multi-layered structure of Ti/Al/Ti.

A first planarization layer 109 may be arranged to cover the source electrode S and the drain electrode D. The first planarization layer 109 may have a flat upper surface.

The first planarization layer 109 may be a single layer or a multi-layer including an organic material or an inorganic material. The first planarization layer 109 may include a polymer (for example, benzocyclobutene ("BCB"), polyimide, hexamethyldisiloxane ("HMDSO"), polymethylmethacrylate, or polystyrene), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer and a combination thereof. The first planarization layer 109 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$) or zinc oxide ($ZnO_2$). In this case, in a method of manufacturing the display apparatus 1, after providing or forming the first planarization layer 109, chemical mechanical polishing may be performed thereon so as to provide a flat upper surface.

A connection metal CM may be arranged on the first planarization layer 109. The connection metal CM may be electrically connected to the TFT by contacting the source electrode S or the drain electrode D of the TFT, through a contact hole provided or formed in the first planarization layer 109.

A line (not illustrated), such as a signal line or conductive line, which is spaced apart from the connection metal CM (e.g., connector or connection plug) in a direction along the substrate 100 and includes a same material as that of the connection metal CM, may be further arranged on the first planarization layer 109. That is, the line and the connection metal CM may be in a same layer among layers arranged on the substrate 100. As used herein, being in a same layer may refer to patterns or elements being respective portions of a same single material layer among material layers arranged on the substrate 100.

A second planarization layer 111 may be arranged on the connection metal CM. The second planarization layer 111 may have a flat upper surface such that a pixel electrode 210 arranged thereon is provided or formed to be flat.

The second planarization layer 111 may be a single layer or a multi-layer including an organic material or an inorganic material. The second planarization layer 111 may include a polymer (for example, benzocyclobutene ("BCB"), polyimide, hexamethyldisiloxane ("HMDSO"), polymethylmethacrylate, or polystyrene), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer and a combination thereof. The second planarization layer 111 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$) or zinc oxide ($ZnO_2$). In this case, in a method of manufacturing the display apparatus 1, after providing or forming the second planarization layer 111, chemical mechanical polishing may be performed thereon so as to provide a flat upper surface.

The second planarization layer 111 may include or define an opening or contact hole exposing the connection metal CM. The pixel electrode 210 may be in contact with the connection metal CM at or through the opening, to be electrically connected to the TFT.

The pixel electrode 210 may include conductive oxide, such as indium tin oxide ("ITO"), indium zinc oxide ("IZO"), zinc oxide ("ZnO"), indium oxide ($In_2O_3$), indium gallium oxide ("IGO") or aluminum zinc oxide ("AZO"). In an embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr) or a combination thereof. In an embodiment, the pixel electrode 210 may further include a layer including ITO, IZO, ZnO or $In_2O_3$ above and/or below the reflective layer. In one or more embodiments, the pixel electrode 210 may have a stacked structure of ITO/Ag/ITO.

A pixel defining layer 113 may be arranged on the pixel electrode 210. The pixel defining layer 113 may include or define an opening exposing the upper surface of the pixel electrode 210, but may cover the outer edge of the pixel electrode 210. The pixel defining layer 113 may include an organic insulating material. Alternatively, the pixel defining layer 113 may include an inorganic insulating material such as silicon nitride, silicon oxynitride or silicon oxide. Alternatively, the pixel defining layer 113 may include an organic insulating material and an inorganic insulating material. Hereinafter, for convenience of description, a case in which the pixel defining layer 113 includes an organic insulating material will be described.

An intermediate layer 220 may include an emission layer 220b. The emission layer 220b may include, for example, an organic material. The emission layer 220b may include a relatively high-molecular-weight organic material or a relatively low-molecular-weight organic material that emits color light. The intermediate layer 220 may include a first functional layer 220a arranged below the emission layer 220b and/or a second functional layer 220c arranged above the emission layer 220b.

The first functional layer 220a may be a single layer or a multi-layer. In an embodiment, for example, when the first functional layer 220a includes a relatively high-molecular-weight material, the first functional layer 220a may be a hole transport layer ("HTL") having a single-layered structure and may include poly-(3,4)-ethylene-dihydroxy thiophene ("PEDOT") or polyaniline ("PANI"). When the first functional layer 220a includes a relatively low-molecular-weight material, the first functional layer 220a may include a hole injection layer ("HIL") and an HTL.

The second functional layer 220c may be optional. In an embodiment, for example, when the first functional layer 220a and the emission layer 220b each include a relatively high-molecular-weight material, the second functional layer 220c may not be provided or formed. The second functional layer 220c may be a single layer or a multi-layer. The second functional layer 220c may include an electron transport layer ("ETL") and/or an electron injection layer ("EIL").

The emission layer 220b of the intermediate layer 220 may be arranged for each pixel P in the second area A2. The emission layer 220b may be arranged to overlap the opening in the pixel defining layer 113 and/or overlap the pixel electrode 210. The first and second functional layers 220a and 220c of the intermediate layer 220 may each be a single body which extends from the second area A2 to the third area A3 so as to be also provided or formed on the dam portion DP.

The opposite electrode 230 may include a conductive material having a relatively low work function. In an embodiment, for example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or any alloy thereof. Alternatively, the opposite electrode 230 may further include a layer such as ITO, IZO, ZnO or $In_2O_3$ on the (semi)transparent layer including the above-described material. The opposite electrode 230 is a single body and may be provided or formed to cover more than one of the pixel electrode 210 in the second area A2. In addition, the opposite electrode 230 may extend from the second area A2 to the third area A3, so as to be also arranged on the dam portion DP. In a method of manufacturing the display apparatus 1, the intermediate layer 220 and the opposite electrode 230 may be provided or formed by thermal evaporation.

A spacer 115 may be provided or formed on the pixel defining layer 113. The spacer 115 may include an organic insulating material such as polyimide. Alternatively, the spacer 115 may include an inorganic insulating material such as silicon nitride or silicon oxide, or may include an organic insulating material and an inorganic insulating material.

In an embodiment, the spacer 115 may include a material that is different from that of the pixel defining layer 113. Alternatively, in an embodiment, the spacer 115 may include the same material as that of the pixel defining layer 113. In this case, in a method of manufacturing the display apparatus 1, the pixel defining layer 113 and the spacer 115 may be provided or formed together in a mask process using a halftone mask or the like. That is, the pixel defining layer 113 and the spacer 115 may be in a same layer as each other. The pixel defining layer 113 and the spacer 115 may each include polyimide.

A thin-film encapsulation layer 300 (e.g., encapsulation layer) may cover the OLED. In an embodiment, the thin-film encapsulation layer 300 may include at least one inorganic encapsulation layer and at least one organic encapsulation layer. In this regard, a first inorganic encapsulation layer 310, a second inorganic encapsulation layer 330, and an organic encapsulation layer 320 therebetween, are illustrated in FIG. 5A.

The thin-film encapsulation layer 300 may extend from the second area A2, to the third area A3. Specifically, the first inorganic encapsulation layer 310 and the second inorganic encapsulation layer 330 may extend from the second area A2, to the third area A3. In this case, the organic encapsulation layer 320 may be shielded by the dam portion DP. In other words, the organic encapsulation layer 320 may not be arranged in the first area A1 owing to the dam portion DP and may be arranged in the second area A2 and a portion of the third area A3 owing to the dam portion DP. Therefore, the first inorganic encapsulation layer 310 and the second inorganic encapsulation layer 330 may meet each other to be in contact with each other within the third area A3 at the dam portion DP.

The first inorganic encapsulation layer 310 and/or the second inorganic encapsulation layer 330 may be arranged according to the shape of the upper surface of the layer arranged therebelow. That is, a cross-sectional profile of the first inorganic encapsulation layer 310 and the second inorganic encapsulation layer 330 may follow a cross-sectional profile of an underlying layer. Referring to FIG. 5A, for example, the first inorganic encapsulation layer 310 may be arranged according to the shape of the upper surface of the opposite electrode 230. The second inorganic encapsulation layer 330 may be arranged according to the shape of the upper surface of the organic encapsulation layer 320.

The first inorganic encapsulation layer 310 and the second inorganic encapsulation layer 330 may each include one or more inorganic insulating materials. The one or more inorganic insulating materials may include aluminum oxide, titanium oxide, tantalum oxide, hafnium oxide, zinc oxide, silicon oxide, silicon nitride and/or silicon oxynitride. In a method of manufacturing the display apparatus 1, the first inorganic encapsulation layer 310 and the second inorganic encapsulation layer 330 may each be provided or formed through chemical vapor deposition.

The upper surface of the organic encapsulation layer 320 may be provided or formed to be flat. Since a lower layer of the organic encapsulation layer 320 is not flat, the lower surface of the organic encapsulation layer 320 may not be flat, but the upper surface of the organic encapsulation layer 320 may be flat as described above.

The organic encapsulation layer 320 may include a polymer-based material. The polymer-based material may include an acryl-based resin, an epoxy-based resin, polyimide, polyethylene and the like. In an embodiment, for example, the organic encapsulation layer 320 may include an acrylic resin such as polymethyl methacrylate, polyacrylic acid or the like. In a method of manufacturing the display apparatus 1, the organic encapsulation layer 320 may be provided or formed by curing a monomer or applying a polymer.

A touch input layer 40 may be arranged on the second inorganic encapsulation layer 330 and may include at least one insulating layer and a sensing electrode. In this case, the touch input layer 40 may extend from the second area A2, to the third area A3. In addition, the touch input layer 40 may be arranged on the dam portion DP in the third area A3.

In the touch input layer 40, insulating layers and conductive layers may be alternately stacked. In an embodiment, the touch input layer 40 may include a first insulating layer 410, a first conductive layer 420, a second insulating layer 430, a second conductive layer 440 and a third insulating layer 450. The first conductive layer 420 and the second conductive layer 440 may be connected to each other at a contact hole (not illustrated) within the touch input layer 40. The sensing electrode may be included in at least one of the first conductive layer 420 and the second conductive layer 440.

The first conductive layer 420 or the second conductive layer 440 may include a metal material layer or a transparent conductive material layer. The metal material layer may include molybdenum (Mo), mendelevium (Md), silver (Ag), titanium (Ti), copper (Cu), aluminum (Al) or any alloy thereof. The transparent conductive material layer may include a transparent conductive oxide such as indium tin oxide ("ITO"), indium zinc oxide ("IZO"), zinc oxide ("ZnO") or indium tin zinc oxide ("ITZO"). In addition, the transparent conductive material layer may include a conductive polymer such as PEDOT, metal nanowires, graphene or the like.

The first conductive layer 420 or the second conductive layer 440 may be a single layer or a multi-layer. The single-layered structure of the first conductive layer 420 or the single-layered structure of the second conductive layer 440 may include a metal layer or a transparent conductive layer. Materials of the metal layer and the transparent conductive layer are the same as described above. One of the first conductive layer 420 and the second conductive layer 440 may include a single metal layer. One of the first conductive layer 420 and the second conductive layer 440 may include a multi-layered metal layer. The multi-layered metal layer may include, for example, three layers of titanium layer/aluminum layer/titanium layer, or two layers of molybdenum layer/mendelevium layer. Alternatively, the multi-layered metal layer may include a metal layer and a transparent conductive layer.

The first conductive layer 420 and the second conductive layer 440 may have different stacked structures from each other or may have the same stacked structure as each other. In an embodiment, for example, the first conductive layer 420 may include a metal layer and the second conductive layer 440 may include a transparent conductive layer. Alternatively, the first conductive layer 420 and the second conductive layer 440 may include a same metal layer as each other.

The materials of the first conductive layer 420 and the arrangement of the sensing electrodes provided by portions of the first conductive layer 420 and portions of the second conductive layer 440, may be determined considering sensing sensitivity. Resistive-capacitive ("RC") delay may affect sensing sensitivity. Since the sensing electrodes including the metal layer have a smaller electrical resistance than an electrical resistance of the transparent conductive layer, an RC value may be reduced. Therefore, a charging time of a sensing capacitor defined between sensing electrodes may be reduced. The sensing electrodes including the transparent conductive layer are not visible from outside the touch input layer 40, as compared with the metal layer, and an input area to which an external input may be applied, may be increased to increase capacitance and/or sensing sensitivity.

The first insulating layer 410, the second insulating layer 430 and the third insulating layer 450 may each include an inorganic insulating material and/or an organic insulating material. The inorganic insulating material may include silicon oxide, silicon nitride or silicon oxynitride, and the organic insulating material may include a relatively high-molecular-weight organic material. In one or more embodiments, the first insulating layer 410 may be omitted or excluded. Hereinafter, a case in which the first insulating layer 410 and the second insulating layer 430 include the inorganic insulating material, and the third insulating layer 450 includes an organic insulating material will be described.

Referring again to FIG. 5A, the dam portion DP may be arranged in the third area A3. In particular, the dam portion DP may be arranged adjacent to the first area A1. That is, the dam portion DP may be closer to the first area A1 than the second area A2. In this case, the dam portion DP may be arranged to surround the first area A1 in a top plan view. In an embodiment, for example, the dam portion DP may be arranged adjacent to a boundary line BL that separates the first area A1 from the third area A3. In particular, the dam portion DP may be arranged such that one side thereof includes the boundary line BL. That is, a boundary of the dam portion DP may coincide or be aligned with the boundary line BL.

The dam portion DP may control the flow of an organic encapsulation layer material forming the organic encapsulation layer 320 during manufacturing of a display apparatus 1, so as to reduce or effectively prevent the material of the organic encapsulation layer 320 from penetrating into the first area A1 from the third area A3. In addition, the dam portion DP may reduce or effectively prevent external impurities introduced through the first area A1 from penetrating into the second area A2, through the organic encapsulation layer 320.

The dam portion DP may include a first base layer ILa, a second base layer 109a, a third base layer 111a, a first layer 113a, a groove Gv provided in plurality (e.g., a plurality of grooves Gv) and a first auxiliary dam 115D. The groove Gv is open in a direction away from the substrate 100. In an embodiment, an end or side surface of the second base layer 109a, an end or side surface of the third base layer 111a and an end or side surface of the first layer 113a, which respectively face the first area A1, may include or be aligned with the boundary line BL.

The first base layer ILa, the second base layer 109a and the third base layer 111a may be sequentially stacked in the third area A3, in a direction away from the substrate 100 (e.g., along a thickness direction or z direction). In one or more embodiments, the first base layer ILa may be omitted. In this case, the first base layer 11a in the third area A3 may include a same material and be in a same layer as the inorganic insulating layer IL in the second area A2, the second base layer 109a in the third area A3 may include a same material and be in a same layer as the first planarization layer 109 in the second area A2, and the third base layer 111a in the third area A3 may include a same material and be in a same layer as the second planarization layer 111 in the second area A2. In a method of manufacturing the display apparatus 1, the first base layer ILa, the second base layer 109a and the third base layer 111a in the third area A3 may be simultaneously provided or formed when the inorganic insulating layer IL, the first planarization layer 109 and the second planarization layer 111 in the second area A2 are provided or formed.

The first layer 113a may be arranged on the third base layer 111a. In this case, the first layer 113a may include a same material and be in a same layer as the pixel defining layer 113. In a method of manufacturing the display apparatus 1, the first layer 113a may be simultaneously provided or formed in the third area A3 when the pixel defining layer 113 is provided or formed in the second area A2.

The first auxiliary dam 115D may be arranged on the first layer 113a. The first auxiliary dam 115D may include a first auxiliary layer 115Da (e.g., first auxiliary dam portion), and a second auxiliary layer 115Db (e.g., second auxiliary dam portion) which is on the first auxiliary layer 115Da. In an embodiment, the first auxiliary layer 115Da and the second auxiliary layer 115Db may include a same material and be in a same layer as each other. In this case, in a method of manufacturing the display apparatus 1, the first auxiliary layer 115Da and the second auxiliary layer 115Db may be provided or formed together in a mask process using a halftone mask or the like. In an embodiment, the first auxiliary layer 115Da and the second auxiliary layer 115Db may include different materials from each other. Hereinafter, for convenience of description, a case in which the first auxiliary layer 115Da and the second auxiliary layer 115Db include the same material and are in a same layer, will be described. In an embodiment, the first auxiliary dam 115D may include the same material as that of the spacer 115.

Similar to the dam portion DP, the first auxiliary dam 115D may control the flow of an organic encapsulation layer material forming the organic encapsulation layer 320, so as to reduce or effectively prevent such material of the organic encapsulation layer 320 from penetrating into the first area A1 from the third area A3. In addition, the first auxiliary dam 115D may reduce or effectively prevent external impurities introduced through the first area A1 from penetrating into the second area A2, through the organic encapsulation layer 320.

The opposite electrode 230, the first inorganic encapsulation layer 310, the second inorganic encapsulation layer 330, the first insulating layer 410 and the second insulating layer 430 may be arranged in order from the substrate 100, at the dam portion DP, and may have a profile following the shape of the surface of the first auxiliary dam 115D within the dam portion DP. In this case, the opposite electrode 230, the first inorganic encapsulation layer 310, the second inorganic encapsulation layer 330, the first insulating layer 410 and the second insulating layer 430 may extend along the substrate 100, in a direction from the second area A2 to the first area A1, so as to be arranged along the shape of the surface of the dam portion DP. Therefore, a stacked structure of the opposite electrode 230, the first inorganic encapsulation layer 310, the second inorganic encapsulation layer 330, the first insulating layer 410 and the second insulating layer 430 may reduce or effectively prevent external impurities from penetrating from the second base layer 109a, the third base layer 111a, the first layer 113a or the first auxiliary dam 115D, to the second area A2, through the organic encapsulation layer 320.

The grooves Gv may be provided or formed in the dam portion DP. Specifically, the grooves Gv may be provided or formed on the first layer 113a. In addition, the grooves Gv may be provided or formed within the third area A3, between the first area A1 and the first auxiliary dam 115D. A pattern of at least one material layer of which the first functional layer 220a, the second functional layer 220c, the opposite electrode 230, the first inorganic encapsulation layer 310, the second inorganic encapsulation layer 330, the first insulating layer 410, the second insulating layer 430 and the third insulating layer 450 is a pattern or portion, may be arranged in the grooves Gv. In this case, a material layer from which the first functional layer 220a, the second functional layer 220c and the opposite electrode 230 is provided, may be disconnected in the third area A3 at a position corresponding to the grooves Gv. This will be described below with reference to FIGS. 6A and 6B.

One or more of a pattern portion 115P may be arranged between the grooves Gv which are adjacent to each other. Therefore, the grooves Gv may be spaced apart from each other in a direction along the substrate 100. In an embodiment, a width of the pattern portion 115P may decrease to a minimum width and then increase from the minimum width, along a thickness direction (e.g., z direction). A maximum thickness of the pattern portion 115P may be less than a maximum thickness of the first auxiliary dam 115D. The pattern portion 115P may include a same material as that of the first auxiliary layer 115Da and/or the spacer 115. In this case, in a method of manufacturing the display apparatus 1, the pattern portion 115P may be provided or formed together in a mask process using a halftone mask or the like, when the first auxiliary dam 115D is provided or formed. The dam portion DP in the third area A3 may include all the layers inclusive from the first base layer ILa to the auxiliary dam layer (e.g., pattern portion 115P plus first auxiliary dam 115D), without being limited thereto. A spacer layer in the display area and the first non-display area may include a collection of the spacer 115, the first auxiliary dam 115D and the pattern portion 115P.

The substrate 100 may further include or define a lower groove LGv corresponding to the third area A3. The lower groove LGv may be provided or formed between the dam portion DP and the second area A2. Specifically, the lower groove LGv may be spaced apart from the dam portion DP in a direction along the substrate 100, from the first area A1 to the second area A2. The lower groove LGv may be closer to a boundary between the second area A2 and the third area A3 than to a boundary between the first area A1 and the third area A3.

A pattern or portion of one or more of the intermediate layer 220, the opposite electrode 230, the first inorganic encapsulation layer 310 and the organic encapsulation layer 320 may be arranged in the lower groove LGv. In this case, the intermediate layer 220 and the opposite electrode 230 may be disconnected in the third area A3 corresponding to a position of the lower groove LGv. In an embodiment, the intermediate layer 220 and/or the opposite electrode 230 may include or define a protrusion protruding into the lower groove LGv, in a direction toward the substrate 100. At the lower groove LGv, the first inorganic encapsulation layer 310 may extend into the lower groove LGv from outside thereof and be arranged over an entire inner surface of the lower groove LGv. A portion of the organic encapsulation layer 320 may be arranged filling the lower groove LGv.

Since the first inorganic encapsulation layer 310 and the organic encapsulation layer 320 remain connected inside the lower groove LGv, a contact area between the substrate 100 and the thin-film encapsulation layer 300 may be increased. Therefore, an adhesive strength between the substrate 100 and the thin-film encapsulation layer 300 may be enhanced.

As described above, the dam portion DP may be arranged adjacent to the boundary line BL between the first area A1 and the third area A3, so as to improve the reliability of the display apparatus 1. In a comparative display apparatus, when the dam portion DP of the third area A3 is spaced apart from the first area A1, an etching amount of the organic material for providing or forming the first base layer ILa, the second base layer 109a, the third base layer 111a and the first layer 113a may be increased. In addition, in order for the touch input layer 40 to be provided or formed on a flat surface, a third planarization layer for planarizing the upper surface between the dam portion DP and the first area A1 may be further included. In this case, a process of providing or forming the third planarization layer is added in manufacturing the comparative display apparatus. Due to the addition of such process, production efficiency of manufacturing comparative display apparatuses is reduced or to defects in the comparative display apparatuses are caused.

In one or more embodiment different from the comparative display apparatus, the dam portion DP which shields flow of a material of the organic encapsulation layer 320 extends up to and including the boundary line BL between the first area A1 and the third area A3, and replaces the role of the third planarization layer discussed above. Therefore, the etching amount of the organic material may be reduced, the process of providing or forming the third planarization layer may be omitted, and the production efficiency of manufacturing the display apparatus 1 may be increased. In addition, since the possibility of defects due to the process of forming the third planarization layer is eliminated, the reliability of the display apparatus 1 which is finally-formed may be improved.

Hereinafter, the shapes of the grooves Gv will be described in detail with reference to FIGS. 6A and 6B.

Figure 6A:
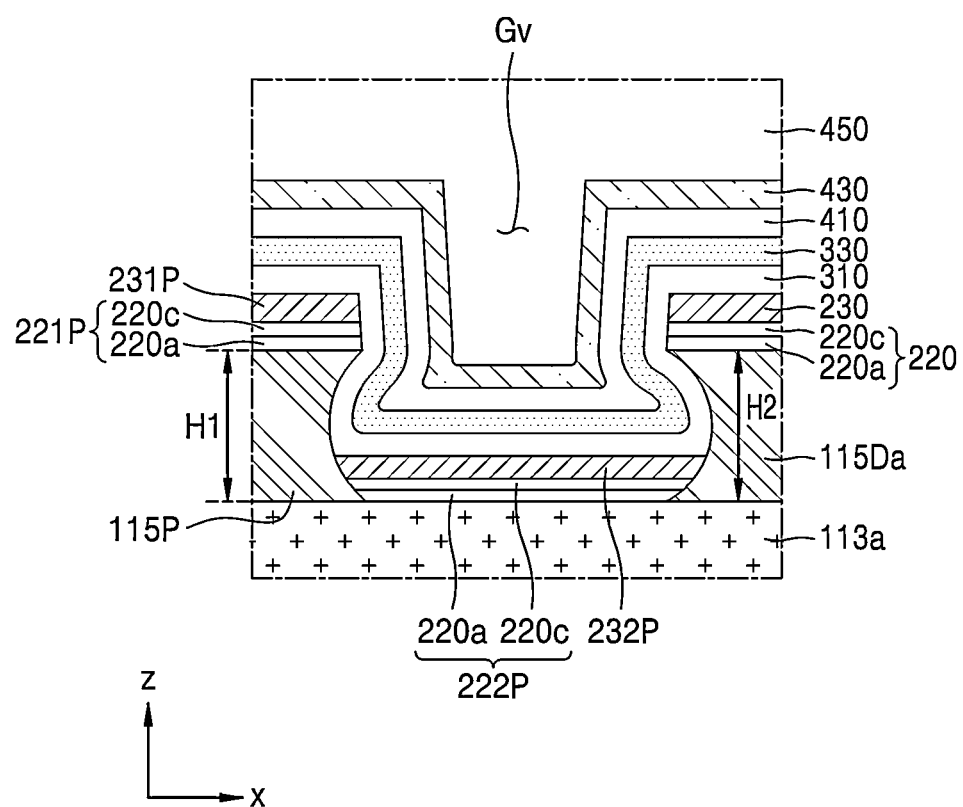
FIGS. 6A and 6B are respectively enlarged cross-sectional views of an embodiment of a groove.
Figure 6B:
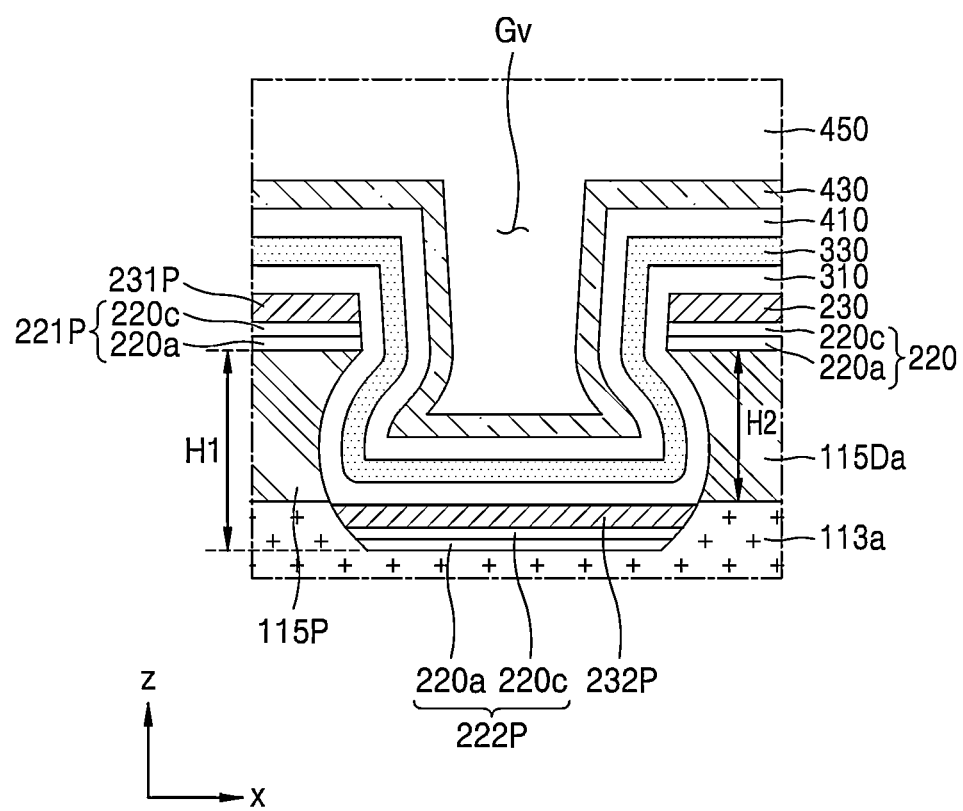

FIGS. 6A and 6B are respectively enlarged cross-sectional views of an embodiment of a groove Gv indicated FIG. 5A by a dotted line box. In FIGS. 6A and 6B, the same reference numerals as those in FIGS. 5A to 5C refer to the same members, and a redundant description thereof will be omitted.

Referring to FIGS. 6A and 6B, a pattern portion 115P and/or a first auxiliary layer 115Da may be arranged on a first layer 113a. A sidewall of the pattern portion 115P faces a sidewall of the first auxiliary layer 115Da. The facing sidewalls and an upper surface of the first layer 113a may together define the groove Gv. The upper surface of the first layer 113a may be defined by a recess in the first layer 113a (FIG. 6B) or by a top surface which is furthest from the substrate 100 (FIG. 6A). A pattern or portion of a first functional layer 220a, a second functional layer 220c, an opposite electrode 230, a first inorganic encapsulation layer 310, a second inorganic encapsulation layer 330, a first insulating layer 410, a second insulating layer 430 and a third insulating layer 450 may be sequentially stacked on the pattern portion 115P and/or the first auxiliary layer 115Da.

In an embodiment, at a respective sidewall among the facing sidewalls, a thickness of the pattern portion 115P may be equal to a thickness of the first auxiliary layer 115Da. In an embodiment, the thickness of the pattern portion 115P may be different from the thickness of the first auxiliary layer 115Da, at the groove Gv. In an embodiment, for example, a thickness of the first auxiliary layer 115Da at a facing sidewall thereof, may be greater than a thickness of the pattern portion 115P at a facing sidewall thereof. In this case, the groove Gv provided between and defined by the facing sidewalls of the pattern portion 115P and the first auxiliary layer 115Da, may be arranged in an asymmetrical shape with respect to the center of the groove Gv. Hereinafter, for convenience of description, a case in which the thickness of the pattern portion 115P is equal to the thickness of the first auxiliary layer 115Da at the groove Gv, will be described in detail.

In an embodiment, a side surface (or sidewall) of the pattern portion 115P or the first auxiliary layer 115Da may be curved. In an embodiment, for example, a width of the pattern portion 115P or the first auxiliary layer 115Da may decrease and then increase along a thickness direction (e.g., z direction). That is, the side surfaces of the auxiliary dam layer which define the groove Gv may be convex in a direction away from a center of the grooves Gv and respectively toward the pattern portion 115P or the first auxiliary layer 115Da.

A first intermediate layer pattern 221P and a first opposite electrode pattern 231P may be arranged in order, on the pattern portion 115P. The first intermediate layer pattern 221P may be a portion of the first functional layer 220a and/or a portion of the second functional layer 220c. In this case, within the third area A3, more than one of the first intermediate layer pattern 221P and more than one of the first opposite electrode pattern 231P may be adjacent to and spaced apart from each other, in a direction along the substrate 100. In addition, the first intermediate layer pattern 221P and the first opposite electrode pattern 231P, as disconnected portions of the intermediate layer 220 and the opposite electrode 230, may be arranged to be spaced apart from a remaining portion of the intermediate layer 220 and the opposite electrode 230, respectively.

More than one of the groove Gv may be arranged between the pattern portion 115P and the first auxiliary layer 115Da, or between the pattern portions 115P which are adjacent to each other.

In an embodiment, the width of each of the grooves Gv may increase and then decrease (e.g., both increases and decreases) along a thickness direction (e.g., z direction). In an embodiment, for example, side surfaces of the auxiliary dam layer which define the grooves Gv, may have an arc shape. In one or more embodiments, the width of each of the grooves Gv may one of increase or decrease along the thickness direction (e.g., z direction). In one or more embodiments, the width of each of the grooves Gv may be constant, that is, not increase or decrease. When a same material layer of which the spacer 115 is a portion, is provided or formed on the first layer 113a and the grooves Gv are then provided or formed from this same material layer, the width of each of the grooves Gv described above may be provided or formed by controlling an etching rate and/or an etching time of an etching process applied to such same material layer.

In an embodiment, a depth H1 of the groove Gv may be equal to a thickness H2 of the first auxiliary layer 115Da or the pattern portion 115P. Referring to FIG. 6A, for example, the depth H1 of the groove Gv may be equal to the thickness H2 of the first auxiliary layer 115Da or the pattern portion 115P. The grooves Gv may include bottom surfaces closest to the substrate 100. The first layer 113a may include an upper surface furthest from the substrate 100. In this case, the bottom surfaces of the grooves Gv may be coplanar with the upper surface or top surface of the first layer 113a. In an embodiment, the depth H1 of the grooves Gv may be different from the thickness H2 of the first auxiliary layer 115Da or the pattern portion 115P. Referring to FIG. 6B, for example, the depth H1 of the grooves Gv may be greater than the thickness H2 of the first auxiliary layer 115Da or the pattern portion 115P. In this case, the grooves Gv may extend into the auxiliary dam layer at the pattern portion 115P and into the first layer 113a. That is, the grooves Gv may be defined by the side surface of the first layer 113a together with the side surface of the auxiliary dam layer.

In an embodiment, the depth H1 of the grooves Gv may be less than the thickness H2 of the first auxiliary layer 115Da or the pattern portion 115P. In this case, more than one of the first auxiliary layer 115Da and the pattern portion 115P which are adjacent to each other along the substrate 100 may be connected to each other. Here, the groove Gv may be solely defined by inner surfaces of the auxiliary dam layer, and a portion of the auxiliary dam layer would separate the groove Gv from the first layer 113a. When a same material layer of which the spacer 115 is a portion, is provided or formed on the first layer 113a and the grooves Gv are then provided or formed from this same material layer, the depth H1 of the grooves Gv described above may be provided or formed by controlling an etching rate or an etching time of an etching process applied to such same material layer.

The second intermediate layer pattern 222P and the second opposite electrode pattern 232P may be arranged inside the grooves Gv. In this case, the second intermediate layer pattern 222P may be a portion of the first functional layer 220a and/or a portion of the second functional layer 220c. Specifically, the second intermediate layer pattern 222P and the second opposite electrode pattern 232P may be arranged on at bottom surfaces of the grooves Gv. In this case, the second intermediate layer pattern 222P and the second opposite electrode pattern 232P as disconnected portions of the intermediate layer 220 and the opposite electrode 230, may be arranged to be spaced apart from a remaining portion of the intermediate layer 220 and the opposite electrode 230, respectively. In addition, the second intermediate layer pattern 222P and the intermediate layer 220 may be respective portions of a same material layer, and the second opposite electrode pattern 232P and the opposite electrode 230 may be respective portions of a same material layer. Therefore, the intermediate layer 220 and the opposite electrode 230 may be disconnected at positions corresponding to the grooves Gv.

The second intermediate layer pattern 222P and the second opposite electrode pattern 232P may be arranged to be spaced apart from the first intermediate layer pattern 221P and the first opposite electrode pattern 231P, respectively. In an embodiment, for example, the second intermediate layer pattern 222P and the first intermediate layer pattern 221P, may be arranged to be spaced apart from each other along the thickness direction (e.g., the z direction). In addition, the second opposite electrode pattern 232P and the first opposite electrode pattern 231P may be arranged to be spaced apart from each other along the thickness direction (e.g., the z direction).

The first inorganic encapsulation layer 310, the second inorganic encapsulation layer 330, the first insulating layer 410 and the second insulating layer 430 may be arranged in the grooves Gv. In this case, the first inorganic encapsulation layer 310, the second inorganic encapsulation layer 330, the first insulating layer 410 and the second insulating layer 430 may be continuously arranged without being disconnected at the grooves Gv. Referring to FIGS. 6A and 6B, the first inorganic encapsulation layer 310, the second inorganic encapsulation layer 330, the first insulating layer 410 and the second insulating layer 430 which are in the grooves Gv, each extends to outside the grooves Gv to remain connected between the grooves Gv.

The first inorganic encapsulation layer 310, the second inorganic encapsulation layer 330, the first insulating layer 410 and the second insulating layer 430 which are in the grooves Gv may for a sub-opening open in a direction away from the substrate 100. The third insulating layer 450 may fill the grooves Gv, that is, may fill the sub-opening and extend to outside the grooves Gv. In this case, a contact area between the touch input layer 40 and the dam portion DP may increase to enhance the adhesive strength therebetween. In addition, the intermediate layer 220, the first intermediate layer pattern 221P and the second intermediate layer pattern 222P may be disconnected from each other to be spaced apart so as to reduce or effectively prevent external impurities from penetrating into the second area A2 through the intermediate layer 220.

Figure 7:
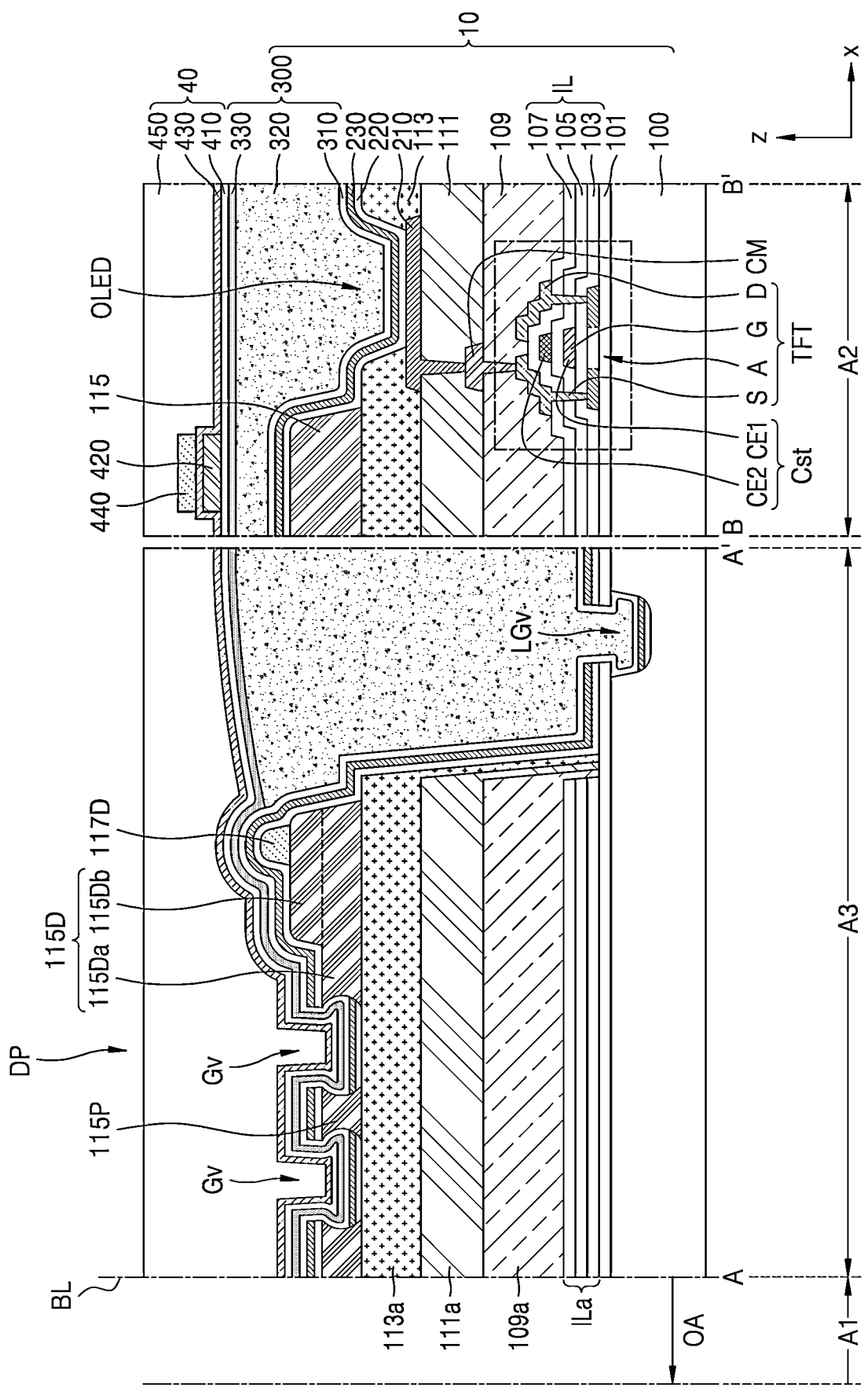
FIG. 7 is a cross-sectional view taken along lines A-A' and B-B' of FIG. 3.

FIG. 7 is an enlarged cross-sectional view taken along lines A-A' and B-B' of FIG. 3, the same reference numerals as those in FIGS. 5A to 5C refer to the same members, and a redundant description thereof will be omitted.

Referring to FIG. 7, a display apparatus 1 may include a first area A1, a second area A2 surrounding the first area A1, and a third area A3 arranged between the first area A1 and the second area A2. In this case, a substrate 100 may include an opening area OA corresponding to the first area A1. An OLED as a display element may include a pixel electrode 210 and an opposite electrode 230. A thin-film encapsulation layer 300 may be arranged to cover the OLED, and a first inorganic encapsulation layer 310 and a second inorganic encapsulation layer 330 may extend to the third area A3 to come into contact with a dam portion DP including a plurality of grooves Gv. In this case, the dam portion DP may be adjacent to and coincide with a boundary line BL that separates the first area A1 from the third area A3.

In the embodiment, the dam portion DP may include a first auxiliary dam 115D, and a second auxiliary dam 117D may be arranged on the first auxiliary dam 115D. In an embodiment, the first auxiliary dam 115D and the second auxiliary dam 117D may include a same material and/or be in a same layer as each other. In this case, in a method of manufacturing the display apparatus 1, the first auxiliary dam 115D and the second auxiliary dam 117D may be provided or formed together in a mask process using a halftone mask or the like. In an embodiment, the first auxiliary dam 115D and the second auxiliary dam 117D may include different materials from each other and/or be in different layers from each other. That is, the first auxiliary dam 115D and the second auxiliary dam 117D may be respective portions of different material layers.

The first auxiliary layer 115Da, the second auxiliary layer 115Db and the second auxiliary dam 117D may form a stepped structure, where an upper surface of the second auxiliary dam 117D is furthest from the substrate 100 than upper surfaces of each of the first auxiliary layer 115Da, the second auxiliary layer 115Db. Similar to the dam portion DP, the first auxiliary dam 115D and the second auxiliary dam 117D may control a flow of an organic encapsulation layer material forming an organic encapsulation layer 320 so as to reduce or effectively prevent the organic encapsulation layer 320 from penetrating into the first area A1 from the third area A3. In addition, the first auxiliary dam 115D and the second auxiliary dam 117D may reduce or effectively prevent external impurities introduced through the first area A1 from penetrating into the second area A2, through the organic encapsulation layer 320.

Figure 8:
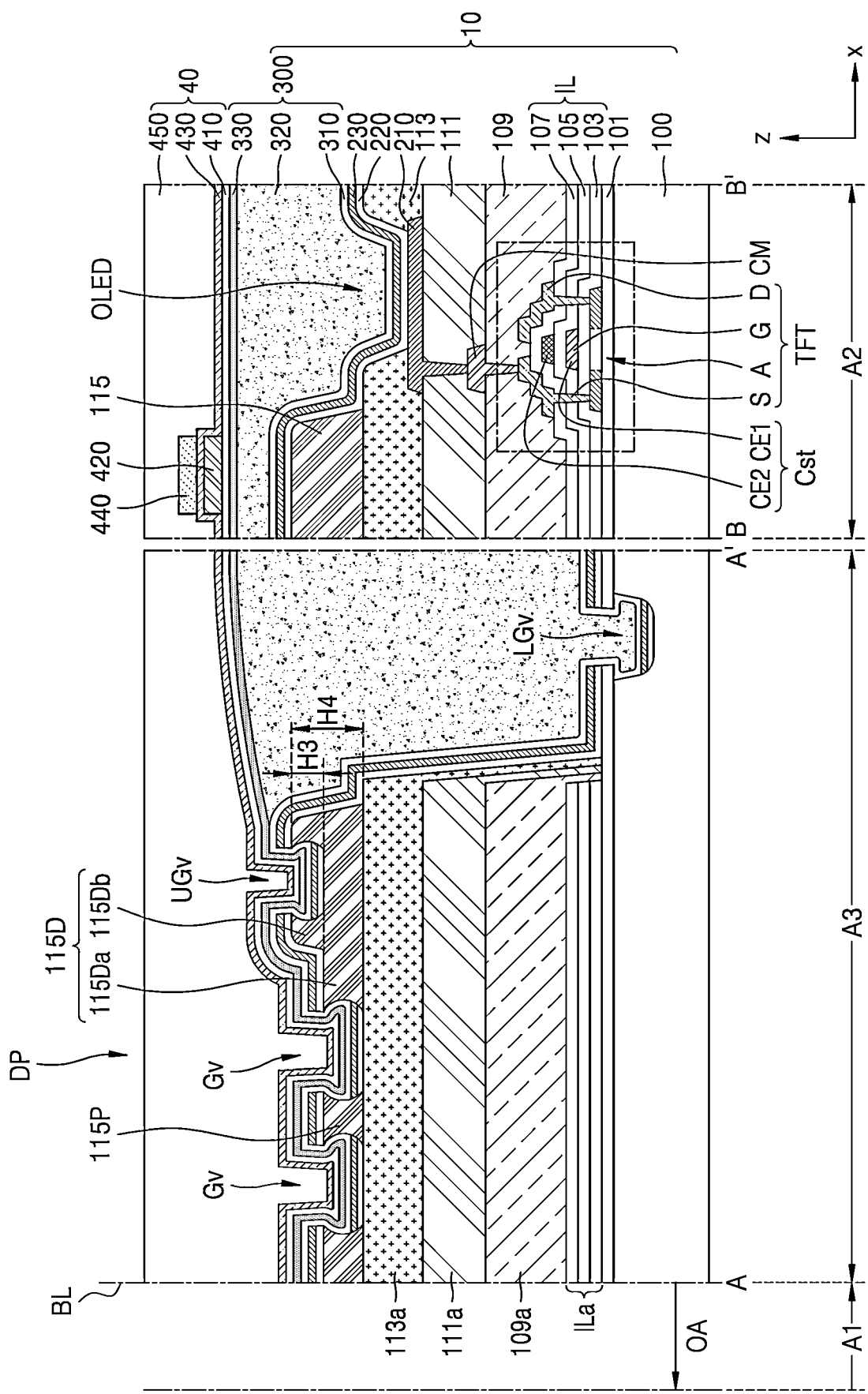
FIGS. 8 and 9 are respectively cross-sectional views taken along lines A-A' and B-B' of FIG. 3.
Figure 9:
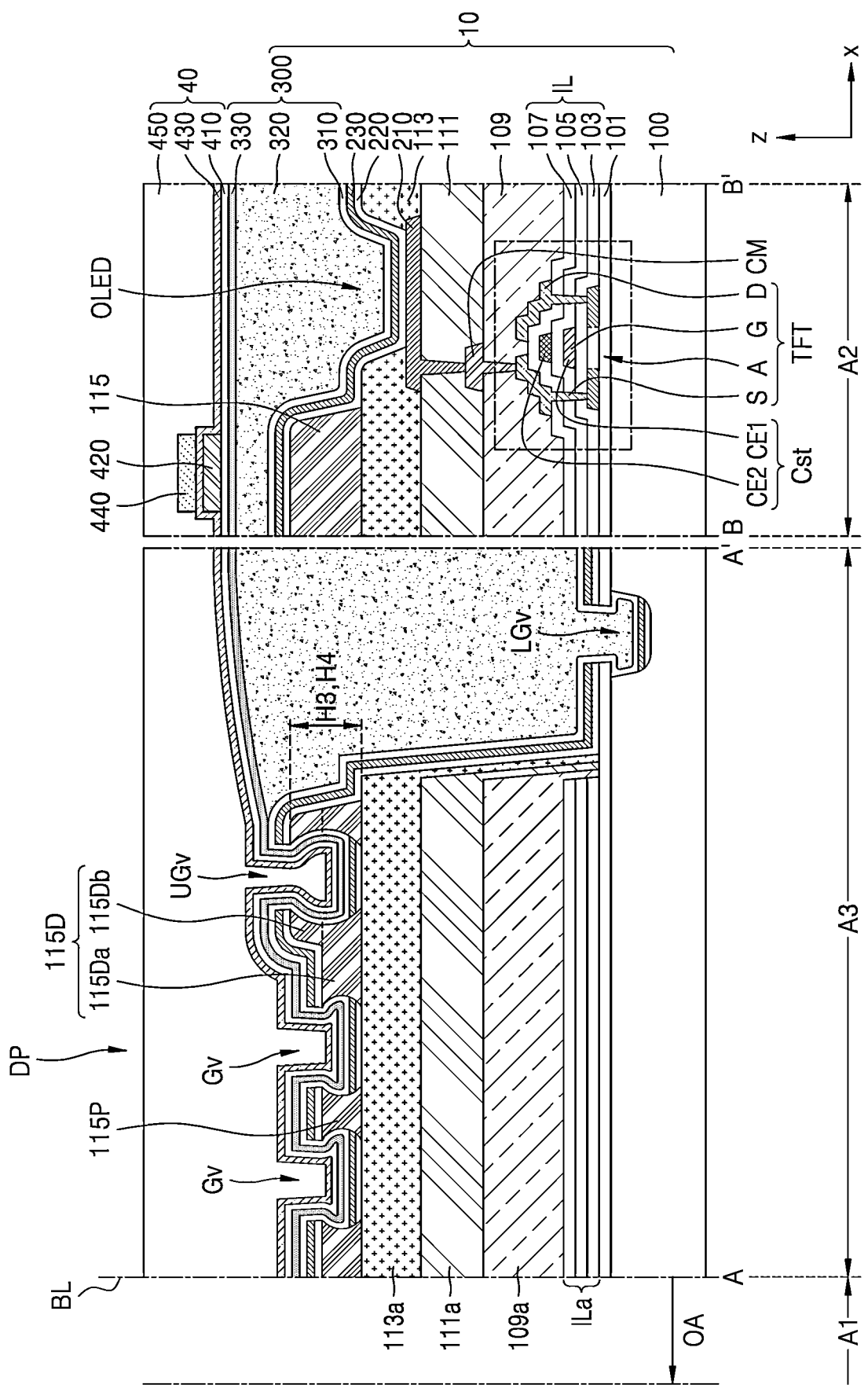

FIGS. 8 and 9 are enlarged cross-sectional views respectively taken along lines A-A' and B-B' of FIG. 3. In FIGS. 8 and 9, the same reference numerals as those in FIGS. 5A to 5C refer to the same members, and a redundant description thereof will be omitted.

Referring to FIGS. 8 and 9, a display apparatus 1 may include a first area A1, a second area A2 surrounding the first area A1, and a third area A3 arranged between the first area A1 and the second area A2. In this case, a substrate 100 may include an opening area OA corresponding to the first area A1. An OLED as a display element may include a pixel electrode 210 and an opposite electrode 230. A thin-film encapsulation layer 300 may be arranged to cover the OLED, and a first inorganic encapsulation layer 310 and a second inorganic encapsulation layer 330 may extend to the third area A3 to come into contact with a dam portion DP including a plurality of grooves Gv. In this case, the dam portion DP may be adjacent to a boundary line BL that separates the first area A1 from the third area A3.

In the embodiment, a first auxiliary dam 115D may include an upper groove UGv. Specifically, the upper groove UGv may be defined by facing sidewalls of a first auxiliary layer 115Da and/or a second auxiliary layer 115Db.

In the embodiment, the width of the upper groove UGv may increase and then decrease along a thickness direction (e.g., z direction). In one or more embodiments, the width of the upper groove UGv may one of increase or decrease along the thickness direction (e.g., z direction). In one or more embodiments, the width of the upper groove UGv may be constant. In a method of manufacturing the display apparatus 1, the upper groove UGv as described above may be simultaneously provided or formed when a plurality of grooves Gv are provided or formed in the auxiliary dam layer. In this case, when the first auxiliary dam 115D is provided or formed and the upper groove UGv is then formed, the width of the upper groove UGv may be defined by controlling an etching rate or an etching time of an etching process of an auxiliary dam layer material.

In an embodiment, a depth H3 of the upper groove UGv which is defined by the first auxiliary dam 115D, may be different from a thickness H4 of the first auxiliary dam 115D, taken from a reference surface, such as the top surface of the first auxiliary dam 115D which is furthest from the substrate 100. Referring to FIG. 8, for example, the depth H3 of the upper groove UGv may be less than the thickness H4 of the first auxiliary dam 115D. In this case, the bottom surface of the upper groove UGv may be coplanar with the upper surface of the first auxiliary layer 115Da which is furthest from the substrate 100. In an embodiment, the depth H3 of the upper groove UGv may be equal to the thickness H4 of the first auxiliary dam 115D. Referring to FIG. 9, for example, the depth H3 of the upper groove UGv which is defined by the first auxiliary dam 115D, may be equal to the thickness H4 of the first auxiliary dam 115D. In this case, the bottom surface of the upper groove UGv may be coplanar with the upper surface of the first layer 113a.

In an embodiment, the depth H3 of the upper groove UGv may be greater than the thickness H4 of the first auxiliary dam 115D. In this case, a side surface of the first layer 113a may define the upper groove UGv together with side surface of the auxiliary dam layer. In this case, in a method of manufacturing the display apparatus 1, when the first auxiliary dam 115D is provided or formed and the upper groove UGv is then provided or formed, the depth of the upper groove UGv may be provided by controlling an etching rate or an etching time of an etching process.

Similar to the inside of the grooves Gv, an intermediate layer pattern and an opposite electrode pattern may be arranged inside the upper groove UGv. A first inorganic encapsulation layer 310, a second inorganic encapsulation layer 330, a first insulating layer 410 and a second insulating layer 430 may also be arranged in the upper groove UGv. In this case, the first inorganic encapsulation layer 310, the second inorganic encapsulation layer 330, the first insulating layer 410 and the second insulating layer 430 may be continuously arranged without being disconnected, as described above with respect to FIGS. 6A and 6B. The third insulating layer 450 may fill the upper groove UGv. In this case, the contact area between the touch input layer 40 and the dam portion DP may increase to enhance the adhesive strength therebetween. Furthermore, with the upper groove UGv, penetration of external impurities into the second area A2 through the intermediate layer 220 may be reduced or effectively prevented and the flow of an organic encapsulation layer material forming the organic encapsulation layer 320 may be controlled.

As described above, one or more embodiments may provide the highly reliable display apparatus 1 in which the dam portion DP is adjacent to the boundary line BL that separates the opening area OA in which a component 20 is disposed, from the first non-display area (e.g., third area A3 around the opening area OA).

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a display element comprising a pixel electrode, an opposite electrode, and an intermediate layer between the pixel electrode and the opposite electrode;
   a substrate comprising:
     an opening area,
     a display area which includes the display element and is adjacent to the opening area, and
     a non-display area between the opening area and the display area;
   an organic layer in the non-display area and defining a first groove, the first groove surrounding the opening area when viewed in a direction perpendicular to the substrate;
   an encapsulation layer comprising a first inorganic encapsulation layer, an organic encapsulation layer, and a second inorganic encapsulation layer in the display area, each covering the display element, wherein the first inorganic encapsulation layer and the second inorganic encapsulation layer each extends from the display area to the non-display area; and
   a touch input layer comprising a first metal layer in the display area, a second metal layer disposed over the first metal layer, a first insulating layer interposed between the first metal layer and the second metal layer, and a second insulating layer covering the second metal layer, the touch input layer facing the substrate with the encapsulation layer therebetween, wherein the second insulating layer is located inside the first groove, and wherein a portion of the second insulating layer which is inside the first groove is located lower than an upper surface of a portion of the organic layer.

2. The display apparatus of claim 1, wherein the second insulating layer includes an organic material.

3. The display apparatus of claim 1, a portion of the first inorganic encapsulation layer is inside the first groove and is in contact with a portion of the second inorganic encapsulation layer which is inside the first groove.

4. The display apparatus of claim 1, wherein the opposite electrode and the intermediate layer extend from the display area to the first groove and are located inside and outside the first groove, such that a portion of the opposite electrode which is inside the first groove is disconnected from a portion of the opposite electrode which is outside the first groove, and a portion of the intermediate layer which is inside the first groove is disconnected from a portion of the intermediate layer which is outside the first groove.

5. The display apparatus of claim 2, wherein the substrate defines a second groove in the non-display area, wherein the second groove is located closer to the display area than the first groove, wherein the opposite electrode and the intermediate layer each is disposed inside and outside the second groove such that a portion of the opposite electrode which is inside the second groove is disconnected from a portion of the opposite electrode which is outside the second groove, and a portion of the intermediate layer which is inside the second groove is disconnected from a portion of the intermediate layer which is outside the second groove, wherein a portion of the first inorganic encapsulation layer covers the portion of the opposite electrode which is inside the second groove and the organic encapsulation layer fills the second groove, and wherein a portion of the organic encapsulation layer which is inside the second groove is located lower than an upper surface of a portion of the substrate.

6. The display apparatus of claim 5, wherein the first groove is disposed in different layer from the layer in which the second groove is disposed.

7. The display apparatus of claim 5, a portion of the first inorganic encapsulation layer which is between the first groove and the second groove is in contact with a portion of the second inorganic encapsulation layer which is between the first groove and the second groove.

8. The display apparatus of claim 1, wherein the second insulating layer is disposed over the display area and the non-display area, and the second insulating layer is integrally formed as a single body.

9. The display apparatus of claim 1, wherein an upper surface of a portion of the second insulating layer which is over the first groove is located higher than an upper surface of a portion of the first insulating layer which is adjacent to the first groove.

10. The display apparatus of claim 1, wherein a portion of the second insulating layer which is in the display area is in contact with the first insulating layer and the second metal layer directly.

11. An electronic apparatus comprising:
a display apparatus comprising:
a display element comprising a pixel electrode, an opposite electrode, and an intermediate layer between the pixel electrode and the opposite electrode;
a substrate comprising:
an opening area,
a display area which includes the display element and is adjacent to the opening area, and
a non-display area between the opening area and the display area;
an organic layer in the non-display area and defining a first groove, the first groove surrounding the opening area when viewed in a direction perpendicular to the substrate;
an encapsulation layer comprising a first inorganic encapsulation layer, an organic encapsulation layer, and a second inorganic encapsulation layer in the display area, each covering the display element, wherein the first inorganic encapsulation layer and the second inorganic encapsulation layer each extends from the display area to the non-display area; and
a touch input layer comprising a first metal layer in the display area, a second metal layer disposed over the first metal layer, a first insulating layer interposed between the first metal layer and the second metal layer, and a second insulating layer covering the second metal layer, the touch input layer facing the substrate with the encapsulation layer therebetween,
wherein the second insulating layer is located inside the first groove, and
wherein a portion of the second insulating layer which is inside the first groove is located lower than an upper surface of a portion of the organic layer.

12. The electronic apparatus of claim 11, wherein the electronic apparatus is a mobile phone, a tablet personal computer, a notebook computer or a smart watch.

* * * * *